United States Patent
Refai-Ahmed et al.

(10) Patent No.: US 7,584,622 B2
(45) Date of Patent: Sep. 8, 2009

(54) LOCALIZED REFRIGERATOR APPARATUS FOR A THERMAL MANAGEMENT DEVICE

(75) Inventors: Gamal Refai-Ahmed, Markham (CA); Roger Schmidt, Poughkeepsie, NY (US)

(73) Assignee: ATI Technologies, Markham, Ontario (CA)

( * ) Notice: Subject to any disclaimer, the term of this patent is extended or adjusted under 35 U.S.C. 154(b) by 417 days.

(21) Appl. No.: 11/162,174

(22) Filed: Aug. 31, 2005

(65) Prior Publication Data

US 2007/0044483 A1 Mar. 1, 2007

(51) Int. Cl.
F25B 21/02 (2006.01)
(52) U.S. Cl. .......................... 62/3.4; 62/259.2
(58) Field of Classification Search .............. 62/3.2, 62/3.4, 3.6, 295.2
See application file for complete search history.

(56) References Cited

U.S. PATENT DOCUMENTS

| | | | | |
|---|---|---|---|---|
| 5,508,884 A | * | 4/1996 | Brunet et al. ................ | 361/698 |
| 5,731,954 A | * | 3/1998 | Cheon ......................... | 361/699 |
| 5,986,884 A | * | 11/1999 | Jairazbhoy et al. ........... | 361/700 |
| 6,082,443 A | * | 7/2000 | Yamamoto et al. ...... | 165/104.26 |
| 6,085,831 A | | 7/2000 | DiGiacomo et al. | |
| 6,196,003 B1 | * | 3/2001 | Macias et al. .................. | 62/3.7 |
| 6,234,240 B1 | * | 5/2001 | Cheon ........................ | 165/80.3 |
| 6,550,531 B1 | | 4/2003 | Searls et al. | |
| 6,705,089 B2 | * | 3/2004 | Chu et al. ...................... | 62/3.2 |
| 6,845,622 B2 | * | 1/2005 | Sauciuc et al. ................. | 62/3.7 |
| 2003/0164289 A1 | | 9/2003 | Weihs et al. | |

* cited by examiner

Primary Examiner—Melvin Jones
(74) Attorney, Agent, or Firm—Vedder Price PC

(57) ABSTRACT

A localized refrigerator apparatus for a thermal management device includes a chamber having an evaporation portion and a condensation portion. The evaporation portion is adapted to thermally couple to a heat generating device. A fluid housed in the chamber and is adapted to facilitate heat transfer between the evaporation portion and the condensation portion by an evaporation and condensation cycle. The thermal management device also includes a thermoelectric cooler thermally coupled to the condensation portion.

27 Claims, 3 Drawing Sheets

LOCALIZED REFRIGERATOR APPARATUS FOR A THERMAL MANAGEMENT DEVICE

FIELD OF THE INVENTION

The present invention generally relates to thermal management devices, and more particularly, to a localized refrigerator apparatus for a thermal management device.

BACKGROUND OF THE INVENTION

Electronic components such as integrated chips generally produce heat when operating. The heat is then transferred to an object to which the electronic component is attached and/or to the surrounding air. However, cooling solutions may be necessary for certain electronic components to maintain the operational temperature thereof below a critical temperature, which if reached, the electronic component may either not operate efficiently or fail due to heat damage.

Various known cooling solutions for such electronic components can be used. A common cooling solution is to attach a heat sink to a circuit substrate such that the heat sink is thermally coupled to the heat generating components of the circuit substrate. A fan may be also coupled to the heat sink to provide forced convection for the heat sink. Such cooling devices, however, may only be capable of cooling a heat generating component down to the ambient temperature. Additionally, the rate by which typical cooling solutions transfer heat away from a heat generating component may not be sufficient for certain heat generating components that generate heat at a high rate. Furthermore, with increasing miniaturization of circuit components, the heat output rate of these components may increase. Accordingly, cooling solutions that can only provide cooling down to the ambient temperature may not suffice in order to provide efficient operation of heat generating components or to prevent heat damage to the heat generating components.

Therefore, there is a need for a thermal management device that is capable of providing cooling below an ambient temperature for one or more heat generating components of a circuit substrate.

BRIEF DESCRIPTION OF THE DRAWINGS

The features of the present invention which are believed to be novel are set forth with particularity in the appended claims. The invention may best be understood by reference to the following description taken in conjunction with the accompanying drawings, and the several figures of which like reference numerals identify like elements.

DETAILED DESCRIPTION OF THE PREFERRED EMBODIMENT

The present disclosure relates to a localized refrigerator apparatus for a thermal management device that includes a chamber having an evaporation portion and a condensation portion. The evaporation portion is adapted to thermally couple to a heat generating device. A fluid is housed in the chamber and is adapted to facilitate heat transfer between the evaporation portion and the condensation portion by an evaporation and condensation cycle. The thermal management device also includes a thermoelectric cooler thermally coupled to the condensation portion.

Figure 1:
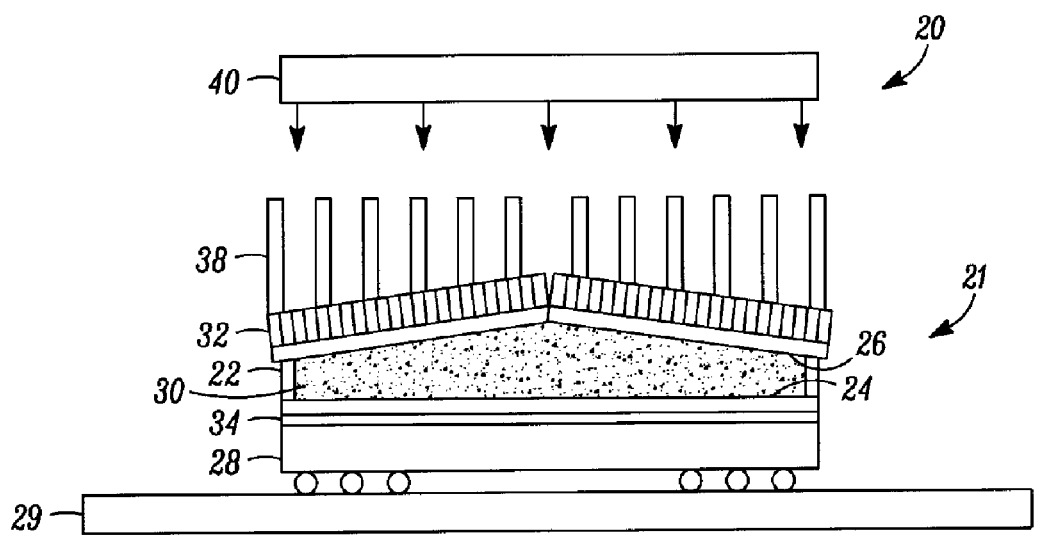
FIG. 1 is a schematic view of a thermal management device having a localized refrigerator apparatus constructed in accordance with the teachings of the present disclosure.

Referring to FIG. 1, a thermal management device 20 constructed in accordance with the teachings of the present disclosure is shown. The thermal management device 20 includes a localized refrigerator apparatus 21 that includes a chamber 22 having an evaporation portion 24 and a condensation portion 26. The evaporation portion 24 can be coupled to a heat generating device 28 of a circuit substrate 29. A fluid 30 is housed in the chamber 22 and can facilitate heat transfer between the evaporation portion 24 and the condensation portion 26 by an evaporation and condensation cycle. The thermal management device 20 further includes one or more thermoelectric coolers 32 that are coupled to the condensation portion 26. The thermal management device 20 may also include one or more thermo electric coolers 33 that are coupled to portions of the evaporation portion 24.

The chamber 22 is sealed so as to contain the fluid 30 therein without any loss of the fluid 30 due to evaporation or leakage. The evaporation portion 24 defines the floor of the chamber 22. The chamber 22 can be mounted on the heat generating device 28 such that the evaporation portion 24 is thermally coupled to the heat generating device 28. The heat generating device 28 may generate heat when powered and can include analogue, digital, and/or optical circuits. A thermal interface 34 can be disposed between the evaporation portion 24 and the heat generating device 28. The thermal interface 34 may be a heat conducting foam, pad, gel, grease, or like substances or materials that can conduct heat between the heat generating device 28 and the evaporation portion 24. Accordingly, the heat generated by the heat generating device 28 can be transferred to the evaporation portion 24 through the thermal interface 34. The thermal interface 34 may also be formed by bonding the evaporation portion 34 to the heat generating component. For example, both of the opposing surfaces of the evaporation portion 34 and the heat generating component 28 can be coated or plated with a metallic substance, such as nickel. A multi-layered reactive foil structure (not shown) can be disposed between the noted metallic coated surfaces. The layers of the foil upon reacting will each other will supply highly localized heat energy that can also melt the noted metallic coating on both the evaporation portion 34 and the heat generating component 28 to bond the evaporation portion 34 to the heat generating component 28. Such reactive foil structures are known to those of ordinary skill in the art. Accordingly, the bond between the evaporation portion 34 and the heat generating component 28 can reduce the thermal resistance between the evaporation portion 34 and the heat generating component 28.

The condensation portion 26 defines the ceiling of the chamber 22. Accordingly, the chamber 22 may be defined by the sealed space between the evaporation portion 24 and the condensation portion 26. The condensation portion 26 is thermally coupled to one or more of the thermoelectric coolers 32. The thermoelectric coolers 32 may be thermally coupled to an extended heat surface 38. An example of an extended heat surface 38 is a heat sink. Additionally, the thermal management device 20 may include one or more forced convection cooling devices that provide forced convection cooling for the extended heat surface 38. In FIG. 1, the thermal management device 20 is shown to include an air mover 40 disposed near the extended heat surface 38 so as to provide forced convection cooling to the extended heat surface 38.

The operation of the thermal management device 20 will now be described. The heat generating device 28 may generate heat while powered. The evaporation portion 24 of the thermal management device 20 is mounted on the heat generating device 28, to thereby absorb the heat that is generated by the heat generating device 28 through the thermal interface 34. The fluid 30 may be in a liquid state and rest inside the chamber 22 on the evaporation portion 24. The fluid 30 has an evaporation/condensation temperature that is less than the evaporation/condensation of water. Accordingly, the fluid 30 may be alcohol, or a similar fluid that can evaporate at a temperature below the evaporation temperature of water, and similarly condense at a temperature below the condensation temperature of water.

When the heat from the heat generating device 28 is transferred to the fluid 30 through the evaporation portion 24, all or portions of the fluid 30 evaporate. The vapor from the fluid 30 then rises inside the chamber 22 and contacts the condensation portion 26. The condensation portion 26 is maintained at a relatively low temperature, i.e., cooled, by the one or more thermoelectric coolers 32. Accordingly, when the vapor from the fluid 30 contacts the condensation portion 26, the vapor condenses on the condensation portion 26 and is transformed back to fluid. The condensation of the fluid 30 on the condensation portion 26 is caused by the heat of vaporization stored in the vapor being transferred to the condensation portion 26.

To provide the flow of the fluid 30 back to the evaporation portion 24 for the above-described evaporation and condensation cycle to continue, the condensation portion 26 can be inclined or sloped so that the fluid can flow downward toward the evaporation portion upon the vapors condensing on the surface of the condensation portion 26. However, such inclined surfaces may not be necessary as the fluid 30 can simply flow o drip toward the evaporation portion 24. The side of the thermoelectric cooler 32 that is opposite to the condensation portion 26 will generate heat when the thermoelectric cooler 32 is operating. The heat generated by the thermoelectric cooler 32 is transferred to the extended heat surface 38. Additionally, if the thermal management device 20 includes the air mover 40, the heat from the extended heat surface 38 can be further dissipated by the forced convection cooling provided by the air mover 40.

Thermoelectric coolers are known in the art and typically include a solid state heat pump that uses the Peltier Effect. A typical thermoelectric cooler includes two thin ceramic wafers with a lattice of P and N doped semiconductor material sandwiched between them, with each P-type material and N-type material forming a couple. The couples are electrically in series and thermally in parallel. By supplying DC current across the couples, the electrons move from the P-type material to the N-type material through an electric connector, causing the electrons to jump to a higher energy state, thereby absorbing thermal energy, i.e., the cool side of the thermoelectric cooler 32. Continuing through the lattice, the electrons flow from the N-type material to the P-type material through an electrical connector, dropping to a lower energy state and releasing energy as heat, i.e., the hot side of the thermoelectric cooler. Depending on the direction of the current, a thermoelectric cooler can be used as a heater or cooler.

Figure 2:
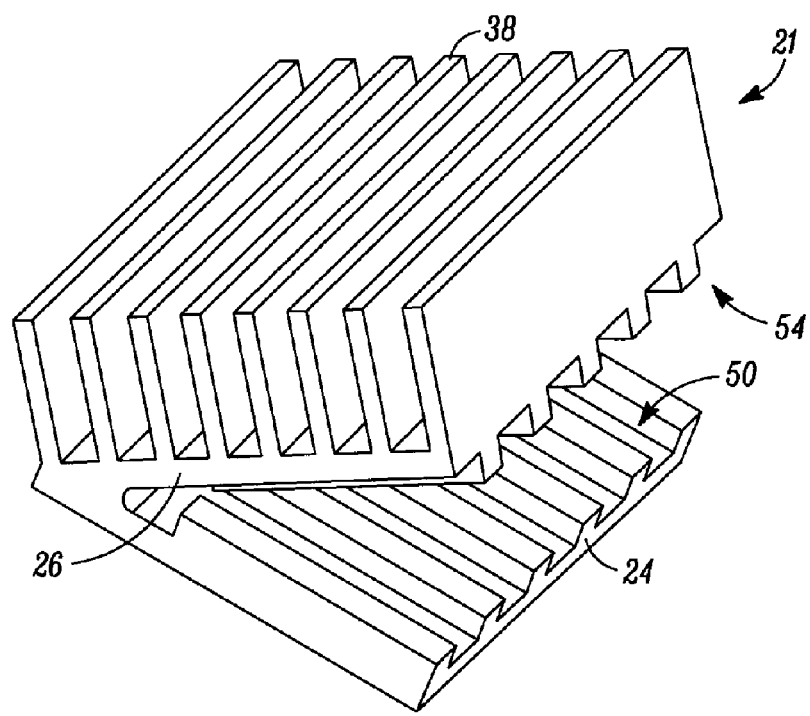
FIG. 2 is a fragmentary perspective view of one example of the thermal management device of FIG. 1.
Figure 3:
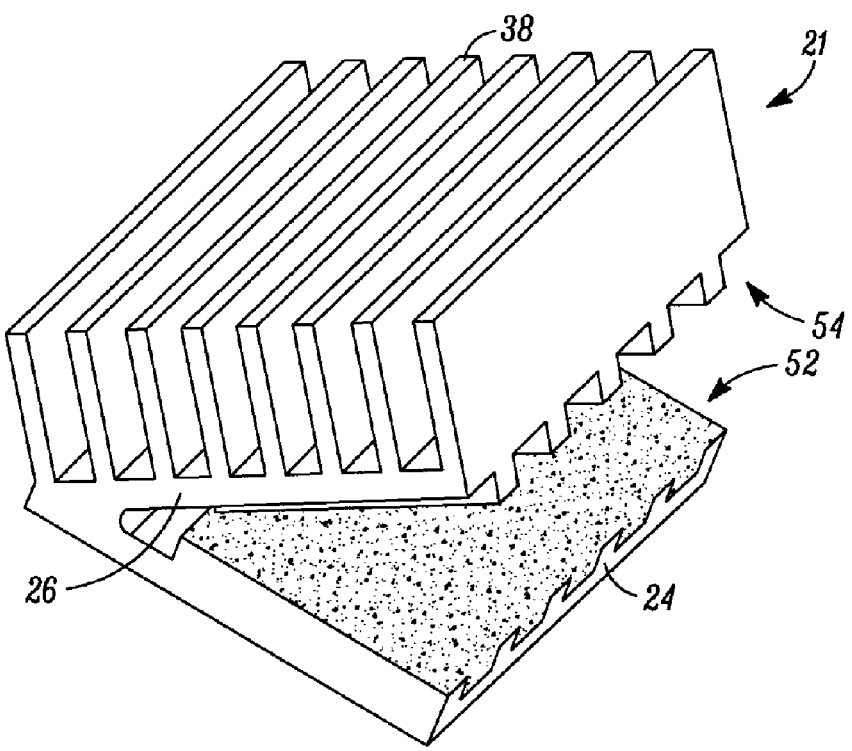
FIG. 3 is a fragmentary perspective view of another example of the thermal management device of FIG. 1.

Because the fluid 30 collects on the evaporation portion 24, the larger the surface area of the evaporation portion 24 is constructed, the more heat may be transferred to the fluid 30 from the heat generating device 28. Accordingly, as shown in FIG. 2, the evaporation portion 24 inside the chamber 22 can be defined by a plurality of channels 50 that extend along the evaporation portion 24 inside the chamber 22. The channels 50 can be in any shape, orientation and/or size so as to provide increased surface area to which the fluid 30 can be exposed. Alternatively, as shown in FIG. 3, the evaporation portion 24 inside the chamber 22 can be defined by a wick structure 52. The wick structure 52 provides a plurality of grooves, spaces and/or pockets where the fluid 30 can reside so as to increase the surface area to which the fluid 30 is exposed. The channels 50 or the wick structure 52 are only two examples of how the evaporation portion 24 inside the chamber 22 can be increased in surface area so as to expose more of the fluid at any given time to the heat generated by the heat generating device 28. For example, another structure that can define the surface of the evaporation portion 24 may be a plurality of microsized dimples in which the fluid 30 can reside. The dimples can collectively increase the surface area of the evaporation portion 24 to distribute more of the heat generated form the heat generating device 28 to the fluid 30 at any given time.

Referring to FIGS. 2 and 3, the condensation portion 26 can also be defined by a plurality of channels 54, a wick structure (not shown), or any other surface structure so as to increase the surface area to which the vapors from the fluid 30 are exposed. As described previously, the condensation portion 26 may be sloped so as to provide flow of the fluid 30 downward toward the evaporation portion 24. As shown in FIG. 1, when the condensation portion 26 is sloped, the center portion of the chamber 22 may include a larger space than the side portions of the chamber 22. The sloped orientation of the condensation portion 26 will provide a pressure gradient from the center of the chamber 22 toward the sides of the chamber 22 that may result in a throttling effect for the condensed fluid 30. The throttling effect generated on the condensation portion 26 and the pressure gradient may also reduce the temperature of the fluid 30 to provide better condensation. Additionally, the channels 54 can provide conduits or passages that facilitate the throttling of the fluid from the center portion of the chamber 22 toward the side portions.

Figure 4:
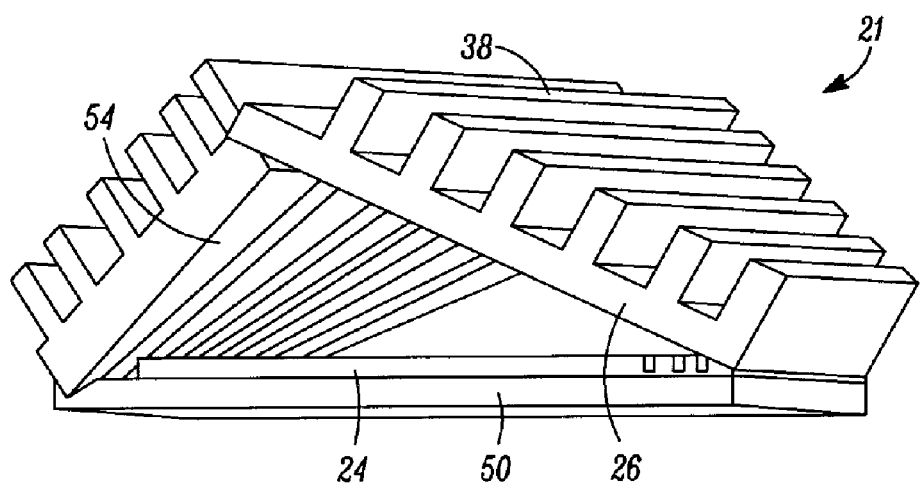
FIG. 4 is a fragmentary perspective view of another example of the thermal management device of FIG. 1.
Figure 5:
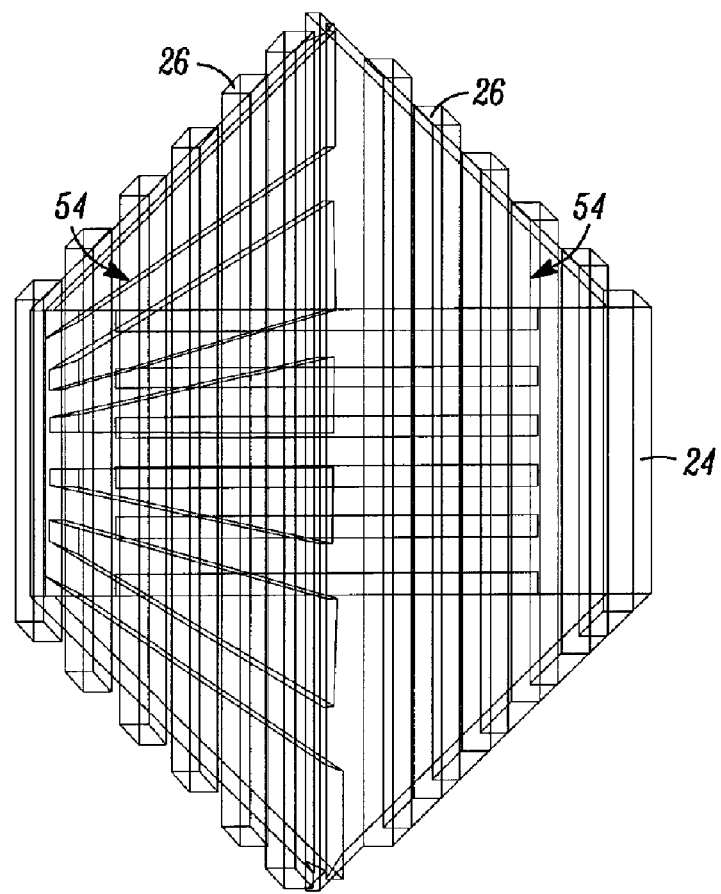
FIG. 5 is a top view of the thermal management device of FIG. 4.

Referring to FIGS. 4 and 5, another example of the disclosed thermal management apparatus 20 constructed in accordance with the teachings of the present disclosure is shown. The condensation portion 26 is shown to be sloped as described above in relation to FIGS. 1-3. However, the condensation portion 26 of FIGS. 4 and 5 has a larger surface area than the surface area of the evaporation portion 24. By having the condensation portion 26 with a larger surface area as shown in FIGS. 4 and 5, the thermoelectric coolers 32 can be sized to cover the entire condensation portion 26 outside of the chamber 22. Accordingly, the condensation portion 26 of FIGS. 4 and 5 has a larger surface area for thermal coupling with a thermoelectrical cooler 32, as compared to the condensation portion 26 of FIGS. 1-3.

Because the condensation portion 26 is not rectangular due to the tapering thereof from the center portion to the side portions, the channels 54 can be wider at the center portion of the chamber 22 as compared to the same channels at the side portions of the chamber 22. Therefore, a narrowing of the channels 54 from the center portion to the side portion results. Accordingly, because of the pressure difference between the center portion of the chamber 22 and the side portions of the chamber 22, and the narrowing of the channels 54 from the center portion to the side portion, a converging of the flow from the center portion to the side portions of the chamber 22 may result. The convergence can cause the velocity of the fluid 30 to be slower at the center of the chamber 22 than the sides of the chamber 22. The reduction of the noted velocity, and the pressure gradient described above, will lead to a reduction of the temperature of the fluid 30 as a result of the throttling process along the channels 54.

Figure 6:
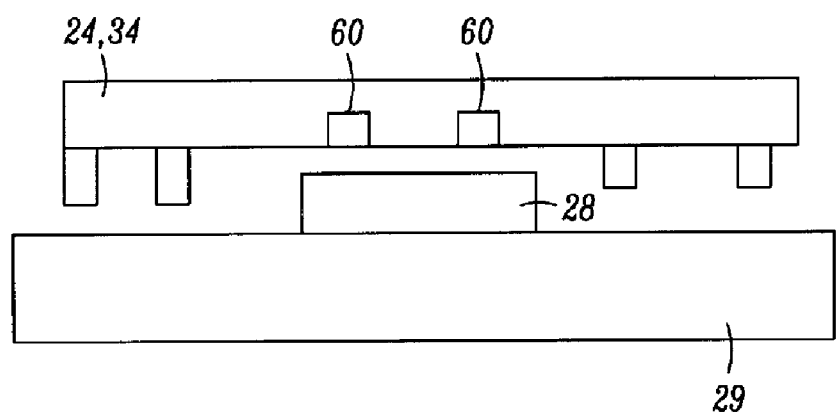
FIG. 6 is a schematic view of a thermal management device having a localized refrigerator apparatus constructed in accordance with the teachings of the present disclosure.

Referring to FIG. 6, another example of the thermal management device 20 constructed in accordance with the teachings of the present disclosure is shown. Certain heat generating devices 28 may have areas of localized heat generation that generate higher heat than the other areas of the heat generating device 28. Such areas are referred to herein as hot spots. Accordingly, it may be necessary to further cool hot spots to provide efficient operation for the heat generating device 28 and to prevent possible damage to the heat generating device 28. As shown in FIG. 6, the evaporation portion 24 or the thermal interface 34 may include one or more thermoelectric coolers 33 embedded therein that when the chamber 22 is mounted on the heat generating device 28, the thermoelectric coolers 33 are in thermal coupling with the hot spots of the heat generating component 28. Accordingly, in addition to the thermal management provided by the thermal management device 20 of FIGS. 1-5, the thermal management device 20 may also include any number of thermoelectric coolers that may be necessary to further cool hot spots, i.e., localized heat generating portions, of the heat generating device 28.

The invention is not limited to particular details of the apparatus and method depicted and the modifications and applications may be contemplated. Certain other changes may be made in the above-described method and apparatus without departing from the true spirit of the scope of the invention herein involved. It is intended, therefore, that the subject matter in the above depiction should be interpreted as illustrative and not in a limiting sense.

What is claimed is:

1. A thermal management device comprising:
   a chamber having an evaporation portion and a condensation portion, the evaporation portion adapted to thermally couple to a heat generating device;
   a fluid housed in the chamber and adapted to facilitate heat transfer between the evaporation portion and the condensation portion by an evaporation and condensation cycle; and
   a thermoelectric cooler thermally coupled to the condensation portion, wherein the evaporation portion defines a plurality of channels to accommodate the fluid to increase a surface area of the evaporation portion.

2. The thermal management device of claim 1, further comprising at least one additional thermoelectric cooler thermally coupled to a portion of the heat generating component.

3. The thermal management device of claim 1, further comprising a heat sink thermally coupled to the thermoelectric cooler.

4. The thermal management device of claim 1, further comprising an air mover thermally coupled to the thermoelectric cooler.

5. The thermal management device of claim 1, wherein the condensation portion defines a plurality of channels extending from a center portion of the condensation portion to side portions of the condensation portion.

6. The thermal management device of claim 5, wherein the channels are generally inclined from the center portion toward the corresponding side portion.

7. The thermal management device of claim 5, wherein the channels narrow in cross section from the center portion toward the corresponding side portion.

8. The thermal management device of claim 1, wherein a surface area of the condensation portion is larger than the surface area of the evaporation portion.

9. A thermal management method for at least one heat generating component of a circuit substrate, the method comprising:
   transferring a heat generated by the heat generating component to an evaporation portion of a chamber of the thermal management device by the evaporation portion being thermally coupled to the heat generating component;
   transferring the heat from the evaporation portion of the thermal management device to a fluid being in contact with the evaporation portion and contained in the chamber, the transferring of the heat to the fluid causing evaporation of the fluid in the chamber;
   cooling a condensation portion of the chamber with a thermoelectric cooler;
   transferring the heat from the evaporated fluid to the cooled condensation portion by the evaporated fluid contacting the cooled condensation portion, the transferring of the heat from the evaporated fluid to the cooled condensation portion causing the evaporated fluid to condense on the cooled condensation portion; and
   returning the condensed fluid to the evaporation portion by fluid flow paths connecting the condensation portion to the evaporation portion.

10. The method of claim 9, further comprising thermally coupling a heat sink to the thermoelectric cooler.

11. The method of claim 9, wherein returning the condensed fluid to the evaporation portion comprises throttling the condensed fluid from a center portion of the condensation portion to side portions of the condensation portion by a plurality of flow channels having a wider cross section at the center portion than a cross section of the corresponding side portion.

12. The method of claim 9, wherein transferring the heat from the evaporation portion to the fluid comprises transferring the heat to a plurality channels, the evaporation portion defining the plurality of channels.

13. The method of claim 9, further comprising thermally coupling at least one portion of the heat generating component to an additional thermoelectric cooler, wherein the additional thermoelectric cooler is positioned relative to the evaporation portion to provide heat transfer from the at least one portion of the heat generating component to the thermoelectric cooler.

14. A circuit assembly comprising:
   a circuit substrate;
   at least one heat generating component mounted on the circuit substrate; and
   a thermal management device thermally coupled to the at least one heat generating component, the thermal management device comprising:
      a chamber having an evaporation portion and a condensation portion, the evaporation portion adapted to thermally couple to a heat generating device;
      a fluid housed in the chamber and adapted to facilitate heat transfer between the evaporation portion and the condensation portion by an evaporation and condensation cycle; and a thermoelectric cooler thermally coupled to the condensation portion.

15. The circuit assembly of claim 14, further comprising at least one additional thermoelectric cooler thermally coupled to a portion of the heat generating component.

16. The circuit assembly of claim 14, further comprising a heat sink thermally coupled to the thermoelectric cooler.

17. The circuit assembly of claim 14, further comprising an air mover thermally coupled to the thermoelectric cooler.

18. The circuit assembly of claim 14, wherein the evaporation portion defines a plurality of channels to accommodate the fluid to increase the surface area of the evaporation portion.

19. The circuit assembly of claim 14, wherein the evaporation portion defines a wick structure to accommodate the fluid to increase the surface area of the evaporation portion.

20. The circuit assembly of claim 14, wherein the condensation portion defines a plurality of channels extending from a center portion of the condensation portion to side portions of the condensation portion.

21. The circuit assembly of claim 20, wherein the channels are generally inclined from the center portion toward the corresponding side portion.

22. The circuit assembly of claims 20, wherein the channels narrow in cross section from the center portion toward the corresponding side portion.

23. The circuit assembly of claim 14, wherein a surface area of the condensation portion is larger than a surface area of the evaporation portion.

24. The circuit assembly of claim 14, wherein the thermal management device is bonded to the heat generating component by a multi-layered reactive foil.

25. A thermal management device comprising:

a chamber having an evaporation portion and a condensation portion, the evaporation portion adapted to thermally couple to a heat generating device;

a fluid housed in the chamber and adapted to facilitate heat transfer between the evaporation portion and the condensation portion by an evaporation and condensation cycle; and a thermoelectric cooler thermally coupled to the condensation portion, wherein a surface area of the condensation portion is larger than a surface area of the evaporation portion.

26. A thermal management device comprising:

a chamber having an evaporation portion and a condensation portion, the evaporation portion adapted to thermally couple to a heat generating device;

a fluid housed in the chamber and adapted to facilitate heat transfer between the evaporation portion and the condensation portion by an evaporation and condensation cycle; and a thermoelectric cooler thermally coupled to the condensation portion, wherein the evaporation portion defines a wick structure to accommodate the fluid to increase the surface area of the evaporation portion.

27. The thermal management device of claim 26, wherein the condensation portion defines a plurality of channels extending from a center portion of the condensation portion to side portions of the condensation portion.

* * * * *

UNITED STATES PATENT AND TRADEMARK OFFICE
CERTIFICATE OF CORRECTION

PATENT NO. : 7,584,622 B2
APPLICATION NO. : 11/162174
DATED : September 8, 2009
INVENTOR(S) : Refai-Ahmed et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 790 days.

Signed and Sealed this

Fourteenth Day of September, 2010

David J. Kappos
*Director of the United States Patent and Trademark Office*